United States Patent
Ogawa et al.

(10) Patent No.: US 10,388,740 B2
(45) Date of Patent: Aug. 20, 2019

(54) SEMICONDUCTOR DEVICE AND FABRICATION METHOD

(71) Applicant: FUJI ELECTRIC CO., LTD., Kanagawa (JP)

(72) Inventors: Eri Ogawa, Matsumoto (JP); Yuichi Onozawa, Matsumoto (JP); Kazutoshi Sugimura, Okaya (JP); Hiroyuki Tanaka, Matsumoto (JP); Kota Ohi, Matsumoto (JP); Yoshihiro Ikura, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 10 days.

(21) Appl. No.: 15/900,648

(22) Filed: Feb. 20, 2018

(65) Prior Publication Data

US 2018/0190779 A1    Jul. 5, 2018

Related U.S. Application Data

(63) Continuation of application No. PCT/JP2017/010047, filed on Mar. 13, 2017.

(30) Foreign Application Priority Data

Mar. 14, 2016   (JP) .................. 2016-050098

(51) Int. Cl.
*H01L 29/08*      (2006.01)
*H01L 29/40*      (2006.01)
(Continued)

(52) U.S. Cl.
CPC ........ *H01L 29/404* (2013.01); *H01L 29/0615* (2013.01); *H01L 29/0619* (2013.01);
(Continued)

(58) Field of Classification Search
CPC ............. H01L 29/0619; H01L 29/401; H01L 29/0615; H01L 21/3065; H01L 29/78;
(Continued)

(56) References Cited

U.S. PATENT DOCUMENTS 5,691,553 A    11/1997   Mori et al.
8,476,691 B1*  7/2013    Sdrulla ................ H01L 29/405
                                                            257/314

(Continued)

FOREIGN PATENT DOCUMENTS

JP   H02-42727 A   2/1990
JP   H08-88346 A   4/1996
(Continued)

OTHER PUBLICATIONS

International Search Report for International Patent Application No. PCT/JP2017/010047, issued by the Japan Patent Office dated May 23, 2017.

(Continued)

*Primary Examiner* — Ahmed N Sefer

(57) ABSTRACT

The position of the side wall of a metal electrode is precisely controlled and the coverage of a layer above the metal electrode is improved. A semiconductor device is provided, including: a semiconductor substrate; and a metal electrode formed above an upper surface of the semiconductor substrate, wherein a side wall of the metal electrode includes a lower portion contacting the semiconductor substrate, and an upper portion that is formed upper than the lower portion and has a smaller inclination relative to the upper surface of the semiconductor substrate than the lower portion. An active region formed in the semiconductor substrate is further included, and the metal electrode may be a field plate formed on an outer side relative to the active region on the upper surface of the semiconductor substrate. The upper (Continued)

US 10,388,740 B2
Page 2 portion of the side wall of the field plate may have an upward-convex shape.

12 Claims, 7 Drawing Sheets

(51) Int. Cl.
    *H01L 29/78* (2006.01)
    *H01L 29/06* (2006.01)
    *H01L 29/66* (2006.01)
    *H01L 29/739* (2006.01)
    *H01L 21/311* (2006.01)
    *H01L 21/3213* (2006.01)

(52) U.S. Cl.
    CPC ...... *H01L 29/401* (2013.01); *H01L 29/66333* (2013.01); *H01L 29/7395* (2013.01); *H01L 29/78* (2013.01); *H01L 21/31144* (2013.01); *H01L 21/32136* (2013.01); *H01L 21/32139* (2013.01)

(58) Field of Classification Search
    CPC ........... H01L 29/66333; H01L 29/7395; H01L 29/404; H01L 21/31144; H01L 21/32136; H01L 21/32139
    See application file for complete search history.

(56) References Cited

U.S. PATENT DOCUMENTS

| | | | | |
|---|---|---|---|---|
| 8,530,978 B1* | 9/2013 | Chu | ...................... | H01L 29/402 257/192 |
| 2002/0019111 A1* | 2/2002 | Pernyeszi | ............. | H01L 21/761 438/400 |
| 2005/0194656 A1* | 9/2005 | Shimizu | ............... | H01L 29/0878 257/488 |
| 2007/0013022 A1* | 1/2007 | Shimizu | .................. | H01L 21/84 257/500 |
| 2008/0169526 A1* | 7/2008 | Wakimoto | .......... | H01L 29/0619 257/490 |
| 2009/0057720 A1* | 3/2009 | Kaneko | ............. | H01L 29/42316 257/194 |
| 2009/0140438 A1 | 6/2009 | Yamazaki et al. | | |
| 2011/0049526 A1* | 3/2011 | Chu | .................. | H01L 21/28587 257/76 |
| 2013/0037852 A1* | 2/2013 | Tamaki | ............... | H01L 29/7811 257/139 |
| 2014/0061659 A1* | 3/2014 | Teplik | .................... | H01L 29/402 257/76 |
| 2014/0077329 A1* | 3/2014 | Abe | ...................... | H01L 29/404 257/488 |
| 2014/0092637 A1 | 4/2014 | Minoura | | |
| 2014/0367738 A1* | 12/2014 | Nakajima | ........... | H01L 29/0661 257/144 |
| 2015/0279722 A1* | 10/2015 | Kikuchi | ................ | H01L 21/765 257/192 |

FOREIGN PATENT DOCUMENTS

| | | |
|---|---|---|
| JP | 2010-251404 A | 11/2010 |
| JP | 2012004466 A | 1/2012 |
| JP | 2013-055214 A | 3/2013 |
| JP | 2013-131569 A | 7/2013 |
| JP | 2014072360 A | 4/2014 |
| JP | 2015-092631 A | 5/2015 |
| JP | 2015-213110 A | 11/2015 |

OTHER PUBLICATIONS

Office Action issued for counterpart Japanese Application No. 2018-505928, drafted by the Japan Patent Office dated Nov. 6, 2018.

* cited by examiner

SEMICONDUCTOR DEVICE AND FABRICATION METHOD

The contents of the following Japanese patent applications are incorporated herein by reference:
NO. 2016-050098 filed in JP on Mar. 14, 2016, and
NO. PCT/JP2017/010047 filed on Mar. 13, 2017.

BACKGROUND

1. Technical Field

The present invention relates to a semiconductor device and a fabrication method.

2. Related Art

Semiconductor devices such as power semiconductor elements are known, in which an electrode having a predetermined shape is formed on the upper surface of a semiconductor substrate (see Patent Document 1, for example). A relatively thick metal is used for the electrode in order to reduce the sheet resistance or the like.

Patent Document 1: Japanese Patent Application Publication No. 2010-251404

Processing the electrode by wet etching allows a thick metal to be processed at a high etching rate. However, it is difficult to perform a fine processing because the electrode is isotropically etched. On the other hand, processing the electrode in the perpendicular direction by dry etching or the like allows a fine processing to be performed easily. However, if the side wall of the electrode is perpendicularly formed, the coverage of a protective film or the like formed above the electrode is deteriorated.

SUMMARY

A first aspect of the present invention provides a semiconductor device including a semiconductor substrate and a metal electrode formed above an upper surface of the semiconductor substrate. A side wall of the metal electrode may have a lower portion contacting the semiconductor substrate, and an upper portion that is formed upper than the lower portion and has a smaller inclination relative to the upper surface of the semiconductor substrate than the lower portion.

The semiconductor device may further include an active region formed in the semiconductor substrate. The metal electrode may be a field plate formed on an outer side relative to the active region on the upper surface of the semiconductor substrate.

The upper portion of the side wall of the field plate may have an upward-convex shape. The lower portion of the side wall of the field plate may have an inclination of 90 degrees or less and 60 degrees or more relative to the upper surface of the semiconductor substrate.

The side wall of the field plate may have a singular point that is arranged between the lower portion and the upper portion and at which inclination relative to the upper surface of the semiconductor substrate changes discontinuously. The singular point may have a height from a lower surface of the field plate in a range of 20% or more and 80% or less of a thickness of the field plate.

A first field plate and a second field plate having a same thickness may be formed above the upper surface of the semiconductor substrate. A distance between a lower end of the first field plate and a lower end of the second field plate may be smaller than a thickness of the field plate.

The semiconductor device may further include an insulating film formed above the upper surface of the semiconductor substrate, wherein the field plate is formed above a partial region of the insulating film. A depression may be formed in a region of the insulating film that is not covered by the field plate.

An inclination of a side wall of the depression in the insulating film relative to the upper surface of the semiconductor substrate may be smaller than an inclination of the lower portion of the field plate relative to the upper surface of the semiconductor substrate. A first field plate and a second field plate may be formed above the upper surface of the semiconductor substrate. A first conductivity-type guard ring may be formed below each of the field plates. A second conductivity-type region may be formed between the guard rings. The upper portion of the side wall, which is one of opposing side walls of the first field plate and the second field plate and is closer to a center of the second conductivity-type region, may have a greater inclination relative to the upper surface of the semiconductor substrate than the upper portion of another one of the side walls.

The singular point of the side wall, which is one of opposing side walls of the first field plate and the second field plate and is closer to the center of the second conductivity-type region, may be arranged upper than the singular point of another one of the side walls.

A second aspect of the present invention provides a fabrication method of a semiconductor device. The fabrication method may include forming a metal electrode above an upper surface of a semiconductor substrate. Forming the metal electrode may include forming a lower portion contacting the semiconductor substrate and an upper portion that is arranged upper than the lower portion and has a smaller inclination relative to the upper surface of the semiconductor substrate than the lower portion in a side wall of the metal electrode.

Forming the metal electrode may include forming a metal film at a region where the metal electrode is to be formed. Forming the metal electrode may include forming a patterned resist film above the metal film. Forming the metal electrode may include shaping a side wall of the resist film according to a shape of a side wall of the metal electrode to be formed. Forming the metal electrode may include performing dry etching of the metal film using the resist film having the shaped side wall.

Shaping the side wall may include heating the resist film on a condition according to the shape of the side wall of the metal electrode to be formed.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
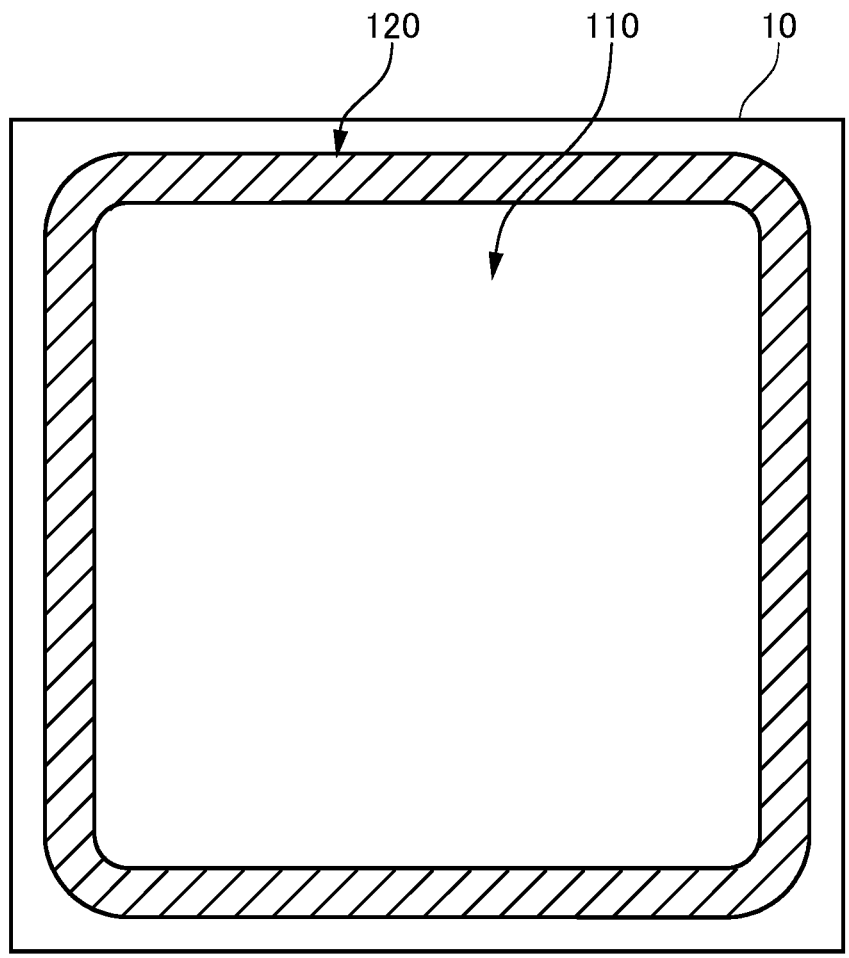
FIG. 1 is a top view showing an overview of a semiconductor device 100.

FIG. 1 is a top view showing an overview of a semiconductor device 100. The semiconductor device 100 includes a semiconductor substrate 10 of silicon, a compound semiconductor or the like. An active region 110 and an edge termination portion 120 are formed in the semiconductor substrate 10. Semiconductor elements such as a transistor and a diode are formed in the active region 110. A power semiconductor element such as an IGBT may be formed in the active region 110.

The edge termination portion 120 is formed to surround the active region 110 on the upper surface of the semiconductor substrate 10. The edge termination portion 120 may be formed along the edge of the semiconductor substrate 10. The edge termination portion 120 suppresses electric field concentration in the vicinity of ends of the active region 110 to improve the withstand voltage of the semiconductor device 100. The edge termination portion 120 may have a guard ring, a field plate and the like.

Figure 2:
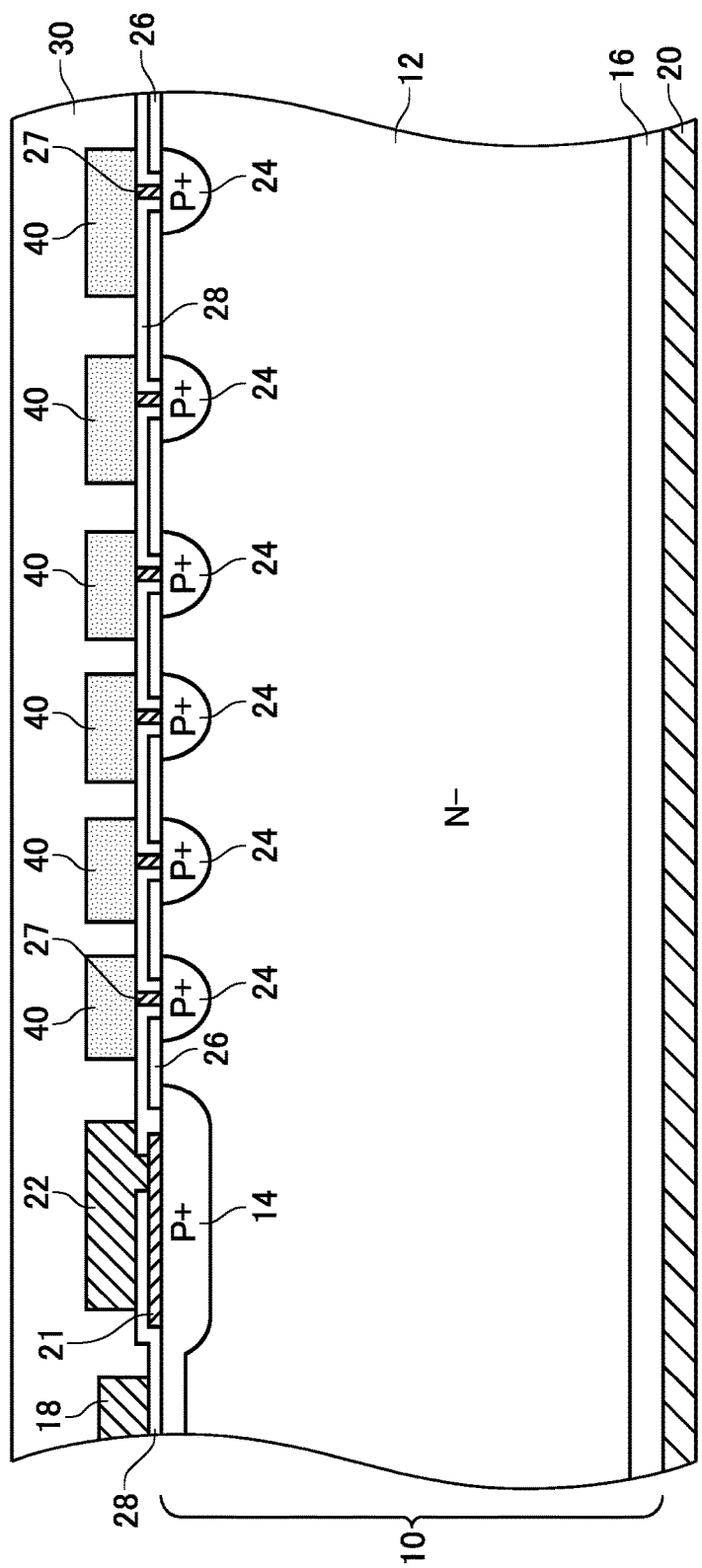
FIG. 2 shows an example of a cross section of an edge termination portion 120.

FIG. 2 shows an example of a cross section of the edge termination portion 120. In FIG. 2, a control electrode 22, a control wiring 21, an upper-surface electrode 18 and a well region 14 formed in the active region 110 are shown together. The control electrode 22 and the upper-surface electrode 18 are examples of a metal electrode. Also, the control wiring 21 is formed of a semiconductor having electrical conductivity such as polysilicon. The control wiring 21 electrically connects an electrode formed on an inner side of the active region 110 and the control electrode 22 to each other. The control wiring 21 connects a gate electrode of an IGBT or the like and the control electrode 22 to each other, for example. The upper-surface electrode 18 functions as an emitter electrode of an IGBT or the like, for example.

The semiconductor substrate 10 includes a second conductivity-type drift region 12 and a lower-surface side region 16. In the present example, the drift region 12 is of (N−)-type. Also, the lower-surface side region 16 is formed on the lower-surface side of the drift region 12. The lower-surface side region 16 has a conductivity type corresponding to a semiconductor element formed in the active region 110. If an IGBT is formed in the active region 110, the lower-surface side region 16 may be of (P+)-type.

A lower-surface electrode 20 of metal such as aluminum is formed on the lower-surface side of the lower-surface side region 16. The lower-surface electrode 20 functions as a collector electrode of an IGBT or the like, for example. Also, an impurity region, a gate structure and the like according to a semiconductor element are formed on the upper-surface side of the semiconductor substrate 10 in the active region 110, but they are omitted in FIG. 2.

The edge termination portion 120 of the present example includes a guard ring 24 and a field plate 40. The guard ring 24 is a first conductivity-type region formed inside the semiconductor substrate 10 and adjacent to the upper surface of the semiconductor substrate 10. In the present example, the guard ring 24 is of (P+)-type. The guard ring 24 is formed in an annular pattern to surround the active region 110 on the upper surface of the semiconductor substrate 10. Also, a plurality of guard rings 24 may be formed in a concentric manner.

A thermally oxidized film 26 and an interlayer insulating film 28 are formed on the upper surface of the semiconductor substrate 10. The interlayer insulating film 28 is formed of a material such as BPSG. The field plate 40 is provided to oppose the guard ring 24 above the upper surface of the semiconductor substrate 10. The field plate 40 of the present example is formed on the interlayer insulating film 28. The field plate 40 is an example of the metal electrode. The field plate 40 may be formed of aluminum, may be formed of aluminum-silicon alloy, may be formed of aluminum-silicon-copper alloy, or may be formed of another metal. A field plate 40 is formed for each guard ring 24.

A connection portion 27 is formed in the interlayer insulating film 28 or the like between the guard ring 24 and the field plate 40. The connection portion 27 penetrates an insulating film such as the interlayer insulating film 28 to electrically connect the guard ring 24 and the field plate 40 to each other. The connection portion 27 may be formed of metal. Also, a protective film 30 is formed above the upper surface of the semiconductor substrate 10 to cover each electrode, the insulating film and the like. The protective film 30 may be of resin such as polyimide.

Figure 3:
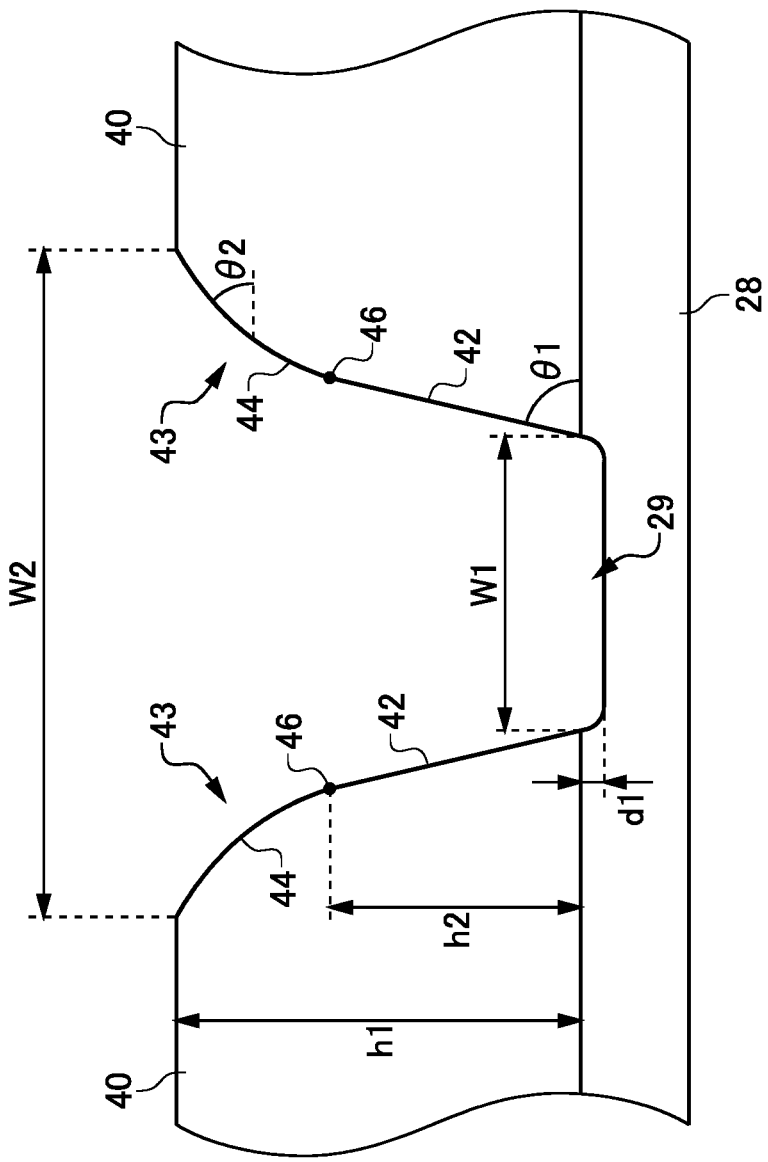
FIG. 3 is a partially enlarged view of a cross section of field plates 40 and an interlayer insulating film 28.

FIG. 3 is a partially enlarged view of a cross section of field plates 40 and the interlayer insulating film 28. FIG. 3 shows the vicinity of two opposing side walls 43 of two adjacent field plates 40. The two opposing side walls 43 of the two field plates 40 have symmetric cross-sectional shapes in FIG. 3, but two side walls 43 may have asymmetric cross-sectional shapes.

A side wall 43 of the field plate 40 has a lower portion 42 and an upper portion 44. The lower portion 42 is a region contacting the semiconductor substrate 10. The upper portion 44 is formed upper than the lower portion 42. The upper portion 44 of the present example is a region contacting the upper surface of the field plate 40.

An inclination θ2 of the upper portion 44 relative to the upper surface of the semiconductor substrate 10 is smaller than an inclination θ1 of the lower portion 42. That is, the side wall 43 of the field plate 40 has an upward-convex shape.

The lower portion 42 has a large inclination θ1 relative to the upper surface of the semiconductor substrate 10, and therefore the position of the lower end of the side wall 43 of the field plate 40 can be precisely controlled. Therefore, thick field plates 40 can be formed at fine intervals, and the semiconductor device 100 can be miniaturized. The inclination θ1 of the lower portion 42 may be 90 degrees or less and 60 degrees or more. More preferably, the inclination θ1 of the lower portion 42 is 75 degrees or more.

Also, the upper portion 44 has a small inclination θ2 relative to the upper surface of the semiconductor substrate 10, and therefore the coverage of the protective film 30 formed above the side wall 43 of the field plate 40 can be improved. The inclination θ2 of the upper portion 44 may be smaller than the inclination θ1 by 10 degrees or more. More preferably, the inclination θ2 of the upper portion 44 is smaller than the inclination θ1 by 20 degrees or more.

The inclination θ1 of the lower portion 42 may refer to the inclination of the side wall 43 of the field plate 40 at its lowest end. The inclination θ2 of the upper portion 44 may refer to the minimum value of the inclination of the side wall 43 of the field plate 40 in a region upper than the lower portion 42. Also, the inclination θ2 of the upper portion 44 may refer to the inclination at the midpoint position of the upper portion 44 in the height direction.

The upper portion 44 refers to the entire region having a smaller inclination than the lower portion 42 in the region upper than the lower portion 42. Also, the side wall 43 of the field plate 40 may have a singular point 46 that is arranged between (or at the boundary of) the lower portion 42 and the upper portion 44, and at which the inclination relative to the upper surface of the semiconductor substrate 10 changes discontinuously. The inclination of the side wall 43 of the field plate 40 may change discontinuously by 5 degrees or more at the singular point 46 as the boundary. Otherwise, the cross section of the side wall 43 lower than the singular point 46 may be a straight line, and the cross section of the side wall 43 upper than the singular point 46 may be a curved line.

Also, a distance W1 between the lower ends of the side walls of two field plates 40 may be smaller than a thickness h1 of the field plate 40. The two field plates 40 of the present example have the same thickness. The semiconductor device 100 allows field plates 40 at even such fine intervals to be precisely formed, and allows the coverage of the protective film 30 or the like to be maintained.

Also, a distance W2 between the upper ends of the side walls 43 of two field plates 40 is greater than the distance W1. Also, the distance W2 may be greater than the thickness h1 of the field plate 40. In this manner, the coverage of the protective film 30 or the like can be further improved.

In an example, the thickness h1 of the field plate 40 is 2 μm or more and 7 μm or less. More preferably, the thickness h1 of the field plate 40 is 4 μm or more and 6 μm or less. The distance W1 is approximately 0.9 times the thickness h1. Also, the distance W2 is approximately two times the thickness h1.

The singular point 46 is arranged such that its height h2 from the lower surface of the field plate 40 is in a range of 20% or more and 80% or less of the thickness h1 of the field plate 40. If the height h2 is excessively large, it is difficult to improve the coverage of the protective film 30 or the like formed above the side wall 43 of the field plate 40. If the height h2 is excessively small, it is difficult to precisely control the position of the lower end of the side wall 43 of the field plate 40. The height h2 of the singular point 46 may be 30% or more and 70% or less of the thickness h1 of the field plate 40.

The outline of the cross section of the upper portion 44 may have a shape of an upward-convex curved line. The outline of the cross section of the lower portion 42 may have a shape of a curved line with a smaller curvature than the upper portion 44, or may have a shape of a straight line. Such shapes allow the coverage of the protective film 30 to be further improved.

A depression 29 may be provided at a region of the upper surface of the interlayer insulating film 28 that is not covered by field plates 40. The side wall of the depression 29 may have a smaller inclination relative to the upper surface of the semiconductor substrate 10 than the inclination θ1 of the lower portion 42 of the side wall 43 of the field plate 40. In this manner, the protective film 30 can be easily formed between two field plates 40 without creating a gap. Therefore, the adhesion reliability or the like of the protective film 30 can be improved. In an example, a depth d1 of the depression 29 is approximately 1/10 of the thickness of the field plate 40.

The present example has described the shape of the side wall 43 of the field plate 40, and a metal electrode other than the field plate 40 may have a similar shape. However, the shape of the side wall 43 as described above has a more significant effect on a metal electrode arranged at relatively fine intervals such as the field plate 40.

Figure 4A:
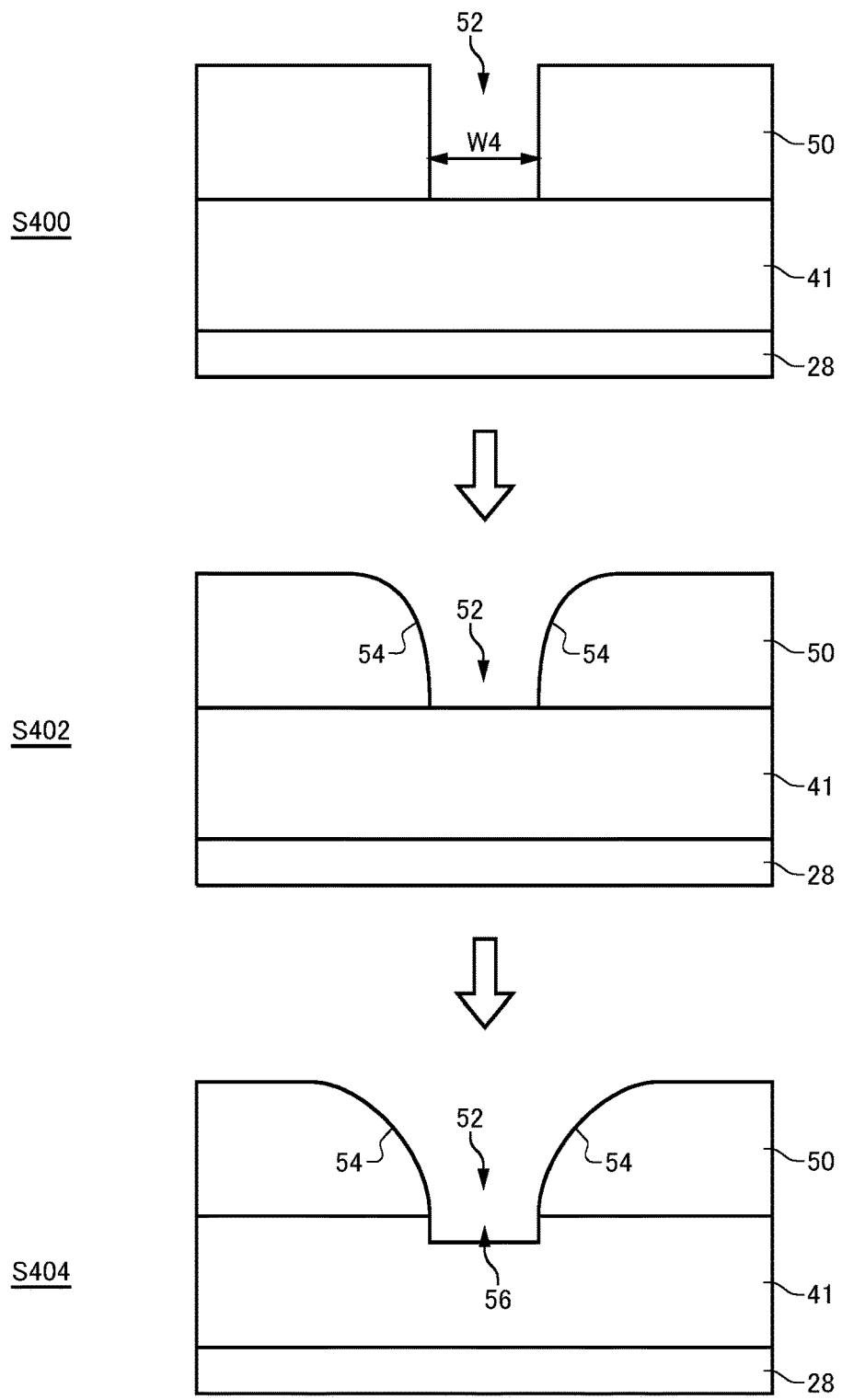
FIG. 4A shows an example of an electrode formation process for forming field plates 40.
Figure 4B:
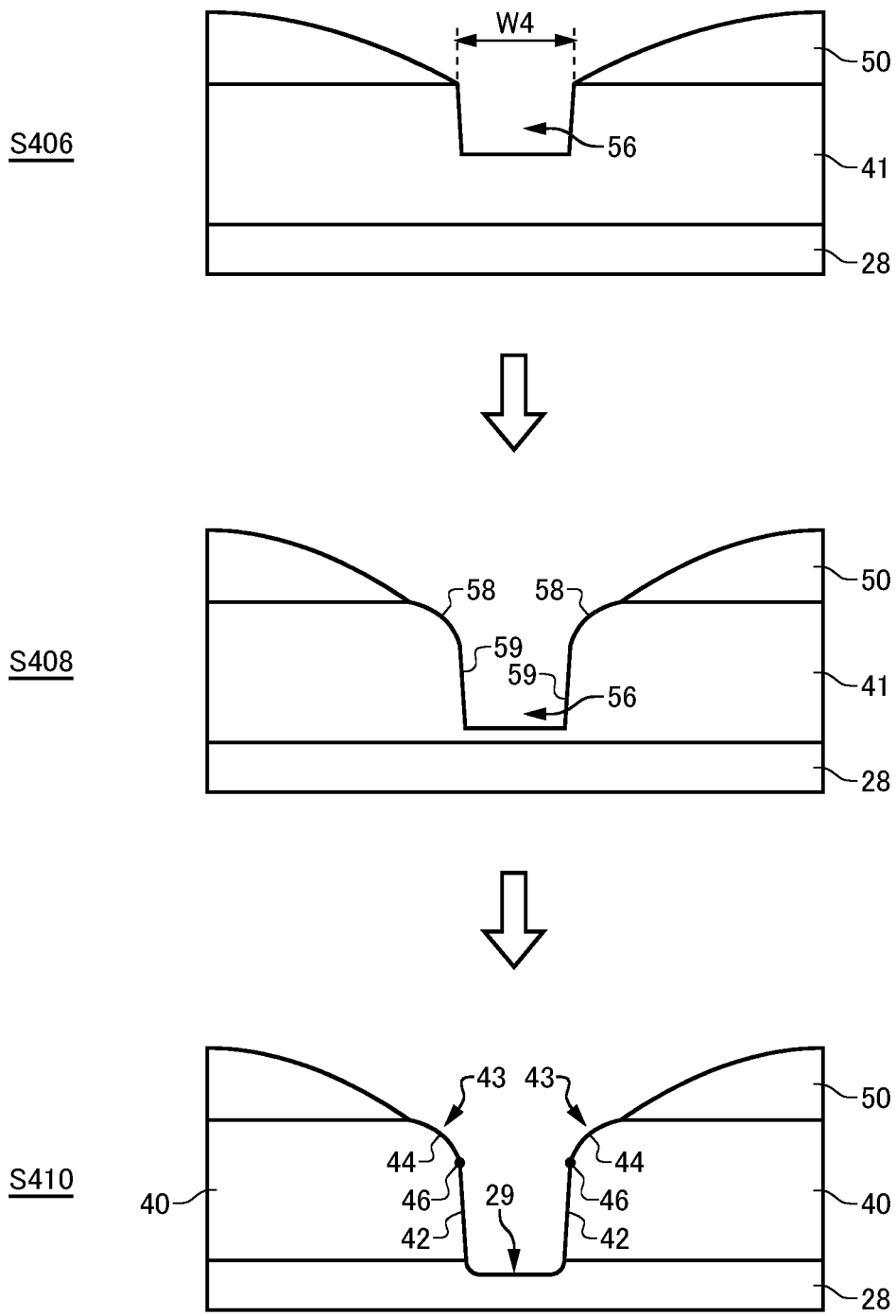
FIG. 4B shows an example of the electrode formation process for forming field plates 40.

FIG. 4A and FIG. 4B show an example of an electrode formation process for forming field plates 40. In the electrode formation process, a lower portion 42 contacting the semiconductor substrate 10 and an upper portion 44 that is arranged upper than the lower portion 42 and has a smaller inclination relative to the upper surface of the semiconductor substrate 10 than the lower portion 42 are formed in the side wall 43 of the field plate 40.

In a step S400 of forming a metal film and a resist film shown in FIG. 4A, a metal film 41 and a resist film 50 are formed. The metal film 41 of the present example is formed in a region on the interlayer insulating film 28 where field plates 40 are to be formed. Also, the resist film 50 is formed above the metal film 41 and is patterned to have a predetermined shape. The resist film 50 of the present example has a groove 52 formed therein corresponding to a region where field plates 40 are not to be formed. The width of the groove 52 is referred to as W4.

Then, in a shaping step S402, a side wall 54 of the resist film 50 is shaped according to the shape of the side wall 43 of the field plate 40 to be formed. In the shaping step S402 of the present example, the side wall 54 is shaped such that the inclination of an upper portion of the side wall 54 of the resist film 50 is smaller than the inclination of a lower portion of the side wall 54. More specifically, the upper portion of the side wall 54 is shaped to be a curved surface that is convex upward.

The resist film 50 of the present example is formed of a photosensitive polymeric material, and thermally contracts by being heated. In the shaping step S402, the resist film 50 is heated to be contracted in its entirety, and thereby the upper portion of the side wall 54 is contracted inward.

The shape of the side wall 54 of the resist film 50 can be controlled by adjusting conditions for forming the resist film 50 such as a resist density and a pattern volume, or conditions for heating such as a heating temperature and a heating time. In the shaping step S402, the resist film 50 is heated on conditions according to the shape of the side wall 43 of the field plate 40 to be formed. For example, the amount of contraction of the upper portion of the side wall 54 of the resist film 50 can be increased by increasing the heating temperature or the heating time. Note that the heat treatment is performed while the resist film 50 is not cured using ultraviolet rays or the like.

Then, in etching steps S404-S410, the metal film 41 is dry-etched using the resist film 50 having the shaped side wall 54. In the etching steps, an etching gas containing a mixture of $BCl_3$ and $Cl_2$ may be used, for example. In an example, etching conditions are as follows: the etching power of the plasma device is 1200 W; the flow rate of $BCl_3$ gas is 40 sccm; the flow rate of $Cl_2$ gas is 100 sccm; and the pressure in the etching chamber is 8 mTorr.

In S404, a groove 56 begins to be formed in a region of the metal film 41 that is not covered by the resist film 50. The inclination of the side wall of the groove 56 relative to the upper surface of the semiconductor substrate 10 is equivalent to the inclination of the lower portion 42 of the side wall 43 of the field plate 40 as shown in FIG. 3.

The inclination of the side wall of the groove 56 can be controlled by adjusting the amount by which polymer generated in the dry etching adheres to the side wall of the groove 56. As a greater amount of polymer adheres to the side wall to protect the side wall, the anisotropy of the etching is enhanced. As a result, the angle of the side wall of the groove 56 becomes nearly 90 degrees. The adhesion amount of polymer can be adjusted by changing the etching conditions described above.

Note that the resist film 50 is etched together with the metal film 41. When the etching further advances, the groove 52 which has been formed in the resist film 50 disappears (S406). That is, the thickness of the resist film 50 on the edge of the groove 56 becomes zero.

When the etching is further advanced, the opening width of the resist film 50 is widened compared to the initial opening width W4 of the groove 52, and the etched region of the metal film 41 is gradually widened along the upper surface of the metal film 41. Therefore, the inclination of an upper side wall 58 of the groove 56 formed in the metal film 41 becomes more gentle than that of its lower side wall 59 (S408). The etching is further advanced, and the metal film 41 is separated to form field plates 40 (S410). In this manner, field plates 40 having side walls in the shape shown in FIG. 3 are formed. In S410, the upper surface of the interlayer insulating film 28 may be etched to a little extent.

Note that a method for controlling the shape of the side wall of the field plate 40 is not limited to a method by adjusting the shape of the side wall of the resist film 50 as described above. For example, in the case of dry etching, the inclination of the side wall of the groove 56 can be adjusted by adjusting the amount of polymer that adheres to the groove 56 of the metal film 41. Therefore, the shape of the side wall of the field plate 40 as shown in FIG. 3 can also be formed by performing a two-step dry etching by changing the adhesion amount of polymer. For example, the upper portion 44 of the side wall 43 of the field plate 40 may be formed on dry-etching conditions such that the side wall 43 has a relatively gentle inclination, and thereafter the lower portion 42 of the side wall 43 of the field plate 40 may be formed on dry-etching conditions such that the side wall 43 has a relatively steep inclination.

Figure 5:
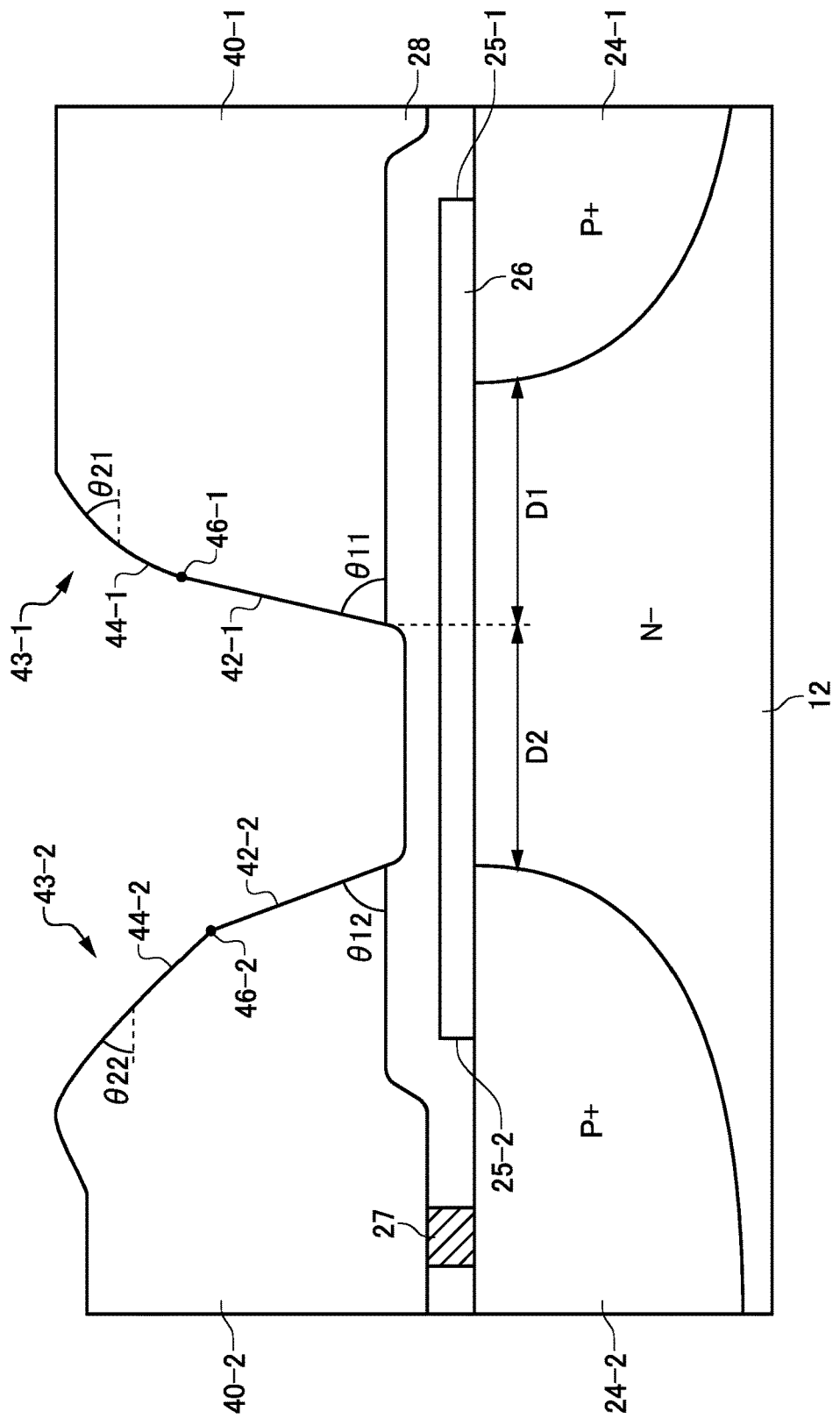
FIG. 5 is a cross-sectional view showing another example of the shape of the side walls of field plates 40.

FIG. 5 is a cross-sectional view showing another example of the shape of the side walls of field plates 40. Opposing side walls 43 of a first field plate 40-1 and a second field plate 40-2 as shown in FIG. 5 have asymmetric shapes. In the present example, the first field plate 40-1 is formed on an outer side relative to the second field plate 40-2 on the semiconductor substrate 10.

A (P+)-type guard ring 24 is formed below each field plate 40. An (N−)-type region of the same conductivity type as the drift region 12 is formed between guard rings 24. In this specification, the region is also referred to as the drift region 12. The length by which the lower end of a side wall 43, which is one of two opposing side walls 43 of two field plates 40, protrudes from the end of the guard ring 24 toward the drift region 12 is greater than the length by which the lower end of the other side wall 43 protrudes from the end of the guard ring 24 toward the drift region 12.

In the present example, the lower end of a side wall 43-1 of the first field plate 40-1 is provided at a position opposing the center of the drift region 12. That is, a distance D1 between the lower end of the side wall 43-1 of the first field plate 40-1 and the end of a first guard ring 24-1 is approximately equal to a distance D2 between the lower end of the side wall 43-1 of the first field plate 40-1 and the end of a second guard ring 24-2. Also, the lower end of a side wall 43-2 of the second field plate 40-2 is provided at a position opposing the end of the second guard ring 24-2.

In the present example, an upper portion 44-1 of the side wall 43-1, which is one of the side walls 43 opposing between the two field plates 40 and is closer to the center of the drift region 12, has a greater inclination relative to the upper surface of the semiconductor substrate 10 than an upper portion 44-2 of the other side wall 43-2 (θ21>θ22). Similarly, an inclination θ11 of a lower portion 42-1 of the side wall 43-1 of the first field plate 40-1 is greater than an inclination θ12 of a lower portion 42-1 of the side wall 43-2 of the second field plate 40-2.

Also, a singular point 46-1 of the side wall 43-1 of the first field plate 40-1 is arranged upper than a singular point 46-2 of the side wall 43-2 of the second field plate 40-2. The lower region 42-1 of the first field plate 40-1 may be formed in a wider range than the lower region 42-2 of the second field plate 40-2. The upper region 44-1 of the first field plate 40-1 may be formed in a narrower range than the upper region 44-2 of the second field plate 40-2.

Such a structure allows the position of the side wall 43-1 of the first field plate 40-1 to be precisely controlled. The position of the side wall of a field plate 40 that protrudes more toward the drift region 12 can be precisely controlled, and therefore the depletion layer can be precisely formed in the drift region 12. Also, the coverage of the protective film 30 or the like above the side wall 43-2 of the second field plate 40-2 can be improved.

Note that two field plates 40 having side walls with asymmetric shapes as shown in FIG. 5 can be formed by altering the shapes of level differences in the underlayer of the field plates 40. For example, an inward-concave depression is provided in the underlayer in the vicinity of the side wall 43-2 of the second field plate 40-2. The second field plate 40-2 sinks in the depression, and therefore the inclination of the side wall 43-2 of the second field plate 40-2 decreases.

The level difference described above may be formed by using the thermally oxidized film 26. As shown in FIG. 2 and FIG. 5, the thermally oxidized film 26 of the present example is formed astride two field plates 40. The distance between an end 25-1 of the thermally oxidized film 26 that is closer to the first field plate 40-1 and the lower end of the side wall 43-1 of the first field plate 40-1 is greater than the distance between an end 25-2 of the thermally oxidized film 26 that is closer to the second field plate 40-2 and the lower end of the side wall 43-2 of the second field plate 40-2.

The end 25-2 of the thermally oxidized film 26 closer to the second field plate 40-2 may be provided at a position opposing the side wall 43-2 of the second field plate 40-2. The end 25-1 of the thermally oxidized film 26 closer to the first field plate 40-1 may not be provided in a range opposing the side wall 43-1 of the first field plate 40-1.

Figure 6:
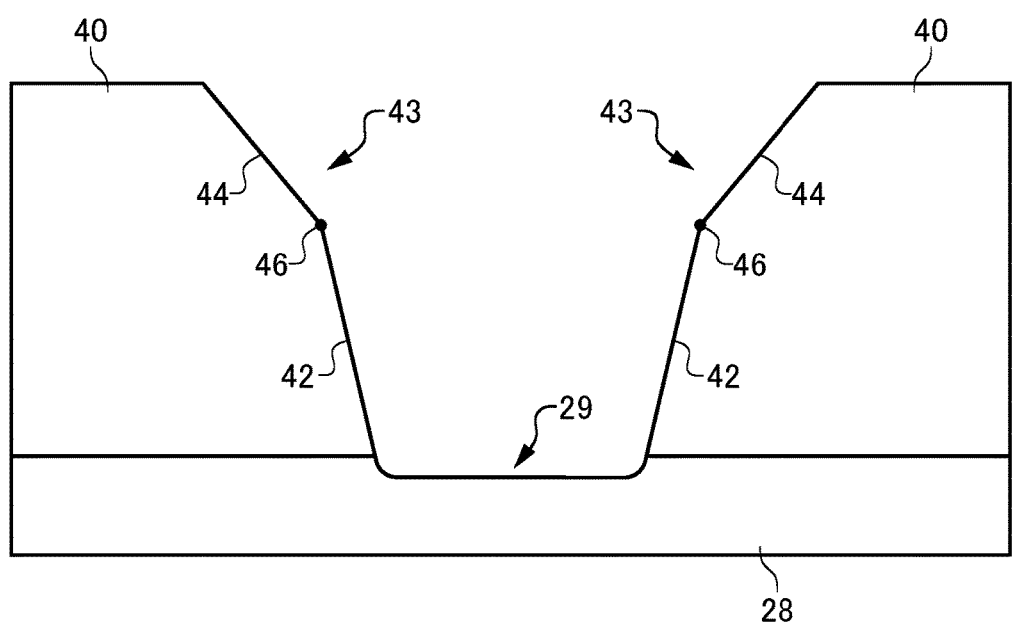
FIG. 6 is a cross-sectional view showing another example of the shape of the side walls of field plates 40.

FIG. 6 is a cross-sectional view showing another example of the shape of the side walls of field plates 40. The cross-sectional shape of the upper portion 44 of the field plate 40 of the present example is a straight line. Note that the cross-sectional shape of the upper portion 44 may entirely be a straight line, or may partially be a straight line. The inclination of the straight line portion of the upper portion 44 is smaller than the inclination of the lower portion 42. Such a structure also allows the position of the side wall of the field plate 40 to be precisely controlled, and allows the coverage of the protective film 30 or the like to be improved.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

In this specification, the words "upper", "lower", "above", "below", "upper surface" and "lower surface" do not indicate the upper and lower directions along the gravitational direction. The "upper" and "lower" directions in this specification indicate relative positional relationship in a direction perpendicular to a principal surface of a semiconductor substrate.

What is claimed is:

1. A semiconductor device comprising:
   a semiconductor substrate;
   an active region formed in the semiconductor substrate;
   an insulating film formed above an upper surface of the semiconductor substrate; and
   a field plate formed above the upper surface of the semiconductor substrate and formed on an outer side relative to the active region on the upper surface of the semiconductor substrate, wherein
   a side wall of the field plate has
      a lower portion contacting the semiconductor substrate, and
      an upper portion that is formed upper than the lower portion and has a smaller inclination relative to the upper surface of the semiconductor substrate than the lower portion,
   the field plate is formed above a partial region of the insulating film, and
   a depression is formed in a region of the insulating film that is not covered by the field plate, the depression being a reduction in a thickness of the insulating film.

2. The semiconductor device according to claim 1, wherein the upper portion of the side wall of the field plate has an upward-convex shape.

3. The semiconductor device according to claim 1, wherein the lower portion of the side wall of the field plate has an inclination of 90 degrees or less and 60 degrees or more relative to the upper surface of the semiconductor substrate.

4. The semiconductor device according to claim 1, wherein the side wall of the field plate has a singular point that is arranged between the lower portion and the upper portion and at which inclination relative to the upper surface of the semiconductor substrate changes discontinuously.

5. The semiconductor device according to claim 4, wherein the singular point is arranged such that its height from a lower surface of the field plate is in a range of 20% or more and 80% or less of a thickness of the field plate.

6. The semiconductor device according to claim 4, wherein
   a first field plate and a second field plate are formed above the upper surface of the semiconductor substrate,
   a first conductivity-type guard ring is formed below each of the field plates,
   a second conductivity-type region is formed between the guard rings, and
   the upper portion of the side wall, which is one of opposing side walls of the first field plate and the second field plate and is closer to a center of the second conductivity-type region, has a greater inclination relative to the upper surface of the semiconductor substrate than the upper portion of another one of the side walls.

7. The semiconductor device according to claim 6, wherein the singular point of the side wall, which is one of opposing side walls of the first field plate and the second field plate and is closer to the center of the second conductivity-type region, is arranged upper than the singular point of another one of the side walls.

8. The semiconductor device according to claim 1, wherein
   a first field plate and a second field plate having a same thickness are formed above the upper surface of the semiconductor substrate, and
   a distance between a lower end of the first field plate and a lower end of the second field plate is smaller than a thickness of the field plate.

9. The semiconductor device according to claim 1, wherein an inclination of a side wall of the depression in the insulating film relative to the upper surface of the semiconductor substrate is smaller than an inclination of the lower portion of the field plate relative to the upper surface of the semiconductor substrate.

10. A fabrication method of a semiconductor device, comprising:
    forming an active region in a semiconductor substrate;
    forming an insulating film above an upper surface of the semiconductor substrate; and
    forming a field plate above the upper surface of the semiconductor substrate and on an outer side relative to the active region on the upper surface of the semiconductor substrate, the field plate being formed above a partial region of the insulating film, wherein
    forming the metal electrode field plate includes:
       forming a lower portion contacting the semiconductor substrate and an upper portion that is arranged upper than the lower portion and has a smaller inclination relative to the upper surface of the semiconductor substrate than the lower portion in a side wall of the field plate; and
       forming a depression in a region of the insulating film that is not covered by the field plate, the depression being a reduction in a thickness of the insulating film.

11. The fabrication method according to claim 10, wherein
    forming the field plate comprises:
       forming a metal film at a region where the field plate is to be formed;
       forming a patterned resist film above the metal film;
       shaping a side wall of the resist film according to a shape of the side wall of the field plate to be formed; and
       performing dry etching of the metal film using the resist film having the shaped side wall.

12. The fabrication method according to claim 11, wherein shaping the side wall includes heating the resist film on a condition according to the shape of the side wall of the field plate to be formed.

* * * * *